United States Patent [19]

Okamoto et al.

[11] Patent Number: 5,795,383
[45] Date of Patent: Aug. 18, 1998

[54] METHOD AND MECHANISM FOR LIFTING GAS FLOW-GUIDE CYLINDER OF A CRYSTAL PULLING APPARATUS

[75] Inventors: Hideo Okamoto, Takefu; Toshiharu Uesugi, Sabae, both of Japan; Atsushi Iwasaki, Vancouver, Wash.; Tetsuhiro Oda, Nishishirakawa, Japan

[73] Assignee: Shin-Etsu Handotai Co., Ltd., Tokyo, Japan

[21] Appl. No.: 760,964

[22] Filed: Dec. 5, 1996

[30] Foreign Application Priority Data

Dec. 28, 1995 [JP] Japan ................... 7-352212

[51] Int. Cl.$^6$ .................................. C30B 15/20
[52] U.S. Cl. ................. 117/30; 117/200; 117/217; 117/222
[58] Field of Search ................. 117/215, 217, 117/218, 222, 13, 30, 200

[56] References Cited

U.S. PATENT DOCUMENTS

| 3,511,610 | 5/1970 | Dohmen ................ 117/217 |
| 5,004,514 | 4/1991 | Hariri .................. 117/217 |

FOREIGN PATENT DOCUMENTS

| 0 373 899 A2 | 6/1990 | European Pat. Off. |
| 0425837 | 5/1991 | European Pat. Off. |
| 0555040 | 8/1993 | European Pat. Off. |
| 0608875 | 8/1994 | European Pat. Off. |
| 1316707 | 4/1963 | France. |
| 404202084A | 7/1992 | Japan .................. 117/218 |
| 404228492A | 8/1992 | Japan .................. 112/218 |

Primary Examiner—Felisa Garrett
Attorney, Agent, or Firm—Oliff & Berridge, PLC

[57] ABSTRACT

A method and a mechanism for lifting a gas flow-guide cylinder of a crystal pulling apparatus are disclosed. The crystal pulling apparatus includes a crucible for accommodating a crystalline material and for melting the crystalline material through heating, and a gas flow-guide cylinder capable of being moved upward/downward above the crucible. The crystal pulling apparatus is operated to grow a single crystal from the crystalline material by a pulling method. When a solid crystalline material is to be placed in the crucible, the gas flow-guide cylinder is moved upward to thereby separate the bottom end of the gas flow-guide cylinder away from the top portion of the crucible. This prevents the crystalline material from coming into contact with the gas flow-guide cylinder.

8 Claims, 4 Drawing Sheets

5,795,383

1

METHOD AND MECHANISM FOR LIFTING GAS FLOW-GUIDE CYLINDER OF A CRYSTAL PULLING APPARATUS

BACKGROUND OF THE INVENTION

1. Field of the Invention

The present invention relates to a method and mechanism for lifting a gas flow-guide cylinder of a crystal pulling apparatus used for pulling upwardly a seed crystal from a melt of a polycrystalline material to thereby obtain a single crystal.

2. Description of the Related Art

Conventionally, a pulling method (Czochralski method, hereinafter called as the "CZ" method) and a floating zone method have been known as methods for obtaining a single crystal from a polycrystalline material such as silicon. In the CZ method, a polycrystalline material is first melted, and a seed crystal is pulled upwardly from the melt of the polycrystalline material. In this method, a shaft or a cable is employed to pull upwardly the seed crystal.

FIG. 3 shows an example of a conventional crystal pulling apparatus employing a cable. As shown in FIG. 3, the crystal pulling apparatus 100 includes a chamber 101, a crucible 102 disposed within the chamber 101, a heater 105 disposed around the crucible 102, a crucible holding shaft 107 and a rotating mechanism 108 for rotating the crucible 102, a seed chuck 22 for holding a seed crystal S of silicon, a cable 110 for pulling upwardly the seed chuck 22, and a winding mechanism 109 for rotating or winding up the cable 110. The winding mechanism 109 includes a winding drive (not illustrated) such as a motor, a drum (not illustrated) for winding up the cable 110, and a rotating drive (not illustrated) for rotating them as a unit such a motor.

The chamber 101 includes a main chamber 101M for housing the crucible 102, and a pull chamber 101P disposed above the main chamber 101M. An annular protrusion 101R is provided in the vicinity of the connection between the main chamber 101M and the pull chamber 101P. The top flange portion of the gas flow-guide cylinder 1 rests on the protrusion 101R to thereby hold the gas flow-guide cylinder 1 in place above the crucible 102.

The crucible 102 is composed of a quartz portion 103 for accommodating a melt L therein and a graphite portion 104 which surrounds the quartz portion 103. A heat insulating material 106 is disposed around the outer circumference of the heater 105.

Next, a description will be given of a method for growing a single crystal using the above-described crystal pulling apparatus 100.

First, a highly purified polycrystalline material of silicon is heated by the heater 105 to a temperature higher than its melting point (about 1400° C.) so as to be melted. Subsequently, the cable 110 is released out such that the tip of the seed crystal S comes into contact with or is dipped into the surface of the melt L at the substantially central portion thereof The crucible holding shaft 107 is then rotated in a desired direction, and the cable 110 is wound up while being rotated, so as to pull upwardly the seed crystal S. In this manner, the operation for growing a single crystal is started. Subsequently, this operation is continued while being accompanied by the following operations: the growth of a single crystal is observed through a viewport 101W provided in the main chamber 101M and through a viewport (not illustrated) provided in the gas flow-guide cylinder 1 at a predetermined position; measurement is performed to obtain required data; and the pulling rate and the temperature are properly adjusted. Thus, a single crystalline ingot C having a generally cylindrical shape is obtained.

2

While a single crystal is being grown, SiO vapor is generated due to the reaction of the quartz portion 103 of the crucible 102 with the silicon melt L. In order to remove this SiO vapor, argon gas G1 is fed into the chamber 101 from the upper portion of the pull chamber 101P. The argon gas G1 flows through the gas flow-guide cylinder 1 and then into the crucible 102 so as to forcibly direct the SiO vapor down the main chamber 101M. The mixed gas G2 comprising argon gas and the SiO vapor is forcibly evacuated from the bottom portion of the main chamber 101M by a vacuum pump (not illustrated) or the like.

FIG. 4 is a cross-sectional view showing the detailed structure of the seed chuck 22 and the end portion of the cable 110, which are used to hold the seed crystal S and suspend it from the cable 110 in the conventional crystal pulling apparatus 100.

As shown in FIG. 4, the seed chuck 22 is composed of a chuck body 23, a seed pin 24, a cable pin 29, and a nut 30. The chuck body 23 is made of a carbon material and is formed in a cylindrical shape. At the bottom of the chuck body 23 is provided a concaved portion 23H1, which has a blind-hole-like shape and extends upward from the bottom surface of the chuck body 23. The seed crystal S is fixed to the chuck body 23 by inserting the seed pin 24 into the chuck body 23 after insertion of the seed crystal S into the concaved portion 23H1. The seed pin 24 is formed of a heat resistant material such as molybdenum, tantalum, or a carbon material.

To the tip of the cable 110 is secured an attachment 26 which has a pin hole 26H. In the upper portion of the chuck body 23 is formed a concaved portion 23H2, which has a blind-hole-like shape and extends downward from the top surface of the chuck body 23. The attachment 26 is received by the concaved portion 23H2. In the upper portion of the chuck body 23 is also formed a pin hole 23H3 which horizontally penetrates the chuck body 23. A male thread is formed at the tip of the cable pin 29, while a female thread is formed in the nut 30.

Accordingly, the seed chuck 22 can be attached to the cable 110 by inserting the cable pin 29 into the pin hole 23H3 after insertion of the attachment 26 into the concaved portion 23H2 and by subsequently attaching and tightening the nut 30.

In the above-described conventional crystal pulling apparatus, a solid silicon material must be first placed into the crucible 102. During this operation, pieces of the solid silicon material are piled up in the crucible 102 in order to obtain a predetermined volume of silicon melt. Therefore, the piled pieces of the solid silicon material come into contact with the gas flow-guide cylinder 1.

In order to solve this problem, the following ideas have been proposed: (1) adding an apparatus for lowering the crucible; (2) reducing the amount of solid silicon material placed in the crucible in order to lower the height of piled solid silicon material; and (3) adding a dedicated apparatus for raising the gas flow-guide cylinder only when solid silicon material is to be placed in the crucible.

However, ideas (1) and (3) involve a large cost for modification of the crystal pulling apparatus, and idea (2) involves a reduction in efficiency of production of a single crystal.

SUMMARY OF THE INVENTION

The present invention has been accomplished to solve the above-mentioned problems, and it is an object of the invention to provide a method and mechanism for lifting a gas flow-guide cylinder of a crystal pulling apparatus so as to prevent charged solid material from coming into contact with the gas flow-guide cylinder, which method and mechanism can be readily realized at low cost.

The present invention provides a method of lifting a gas flow-guide cylinder of a crystal pulling apparatus which includes a heating container for accommodating a crystalline material and for melting the crystalline material through heating, and a gas flow-guide cylinder capable of being moved upward/downward above said heating container, and which is adapted to grow a single crystal from the crystalline material by a pulling method. In the method of lifting the gas flow-guide cylinder, when the crystalline material in a solid form is to be placed in the heating container, the gas flow-guide cylinder is moved upward to thereby separate the bottom end of the gas flow-guide cylinder away from the top portion of the heating container.

The present invention also provides a mechanism for lifting a gas flow-guide cylinder of a crystal pulling apparatus. The crystal pulling apparatus includes a heating container for melting a crystalline material and for melting the crystalline material through heating, a lifting member capable of being moved upward/downward above the heating container, and a gas flow-guide cylinder capable of being supported in place above the heating container. In the crystal pulling apparatus, a seed crystal is first attached to the lifting member, and the lifting member is moved downward so as to cause the seed crystal to contact a melt of the crystalline material and is subsequently pulled upwardly, while a gas is flowing through the gas flow-guide cylinder toward the melt, so as to grow a single crystal from the melt.

In the mechanism for lifting the gas flow-guide cylinder, there is provided a lifting jig which can be engaged with and disengaged from the lifting member and the gas flow-guide cylinder. When the crystalline material in the solid form is to be placed in the heating container, the lifting jig is engaged with the gas flow-guide cylinder and the lifting member, and the lifting member is subsequently pulled upward so as to separate the bottom end of the gas flow-guide cylinder away from the top portion of the heating container.

Preferably, in the mechanism for lifting a gas flow-guide cylinder of a crystal pulling apparatus, the lifting member includes a seed crystal holder for holding a seed crystal, and the lifting jig can be removably attached to the seed crystal holder.

Preferably, in the mechanism for lifting a gas flow-guide cylinder of a crystal pulling apparatus, a first anchorage portion is provided at the upper portion of the gas flow-guide cylinder, and a second anchorage portion engageable with the first anchorage portion is provided on the lifting jig.

Preferably, in the mechanism for lifting a gas flow-guide cylinder of a crystal pulling apparatus, the first anchorage portion is formed separately from the gas flow-guide cylinder and is attached to the upper portion of the gas flow-guide cylinder.

Preferably, in the mechanism for lifting a gas flow-guide cylinder of a crystal pulling apparatus, the lifting jig is made of a heat resistant material.

Preferably, in the mechanism for lifting a gas flow-guide cylinder of a crystal pulling apparatus, the first anchorage portion is made of a heat resistant material.

Preferably, the mechanism for lifting a gas flow-guide cylinder of a crystal pulling apparatus further comprises a positioning jig disposed above the heating container and supported by the inner surface of a housing body which accommodates the heating container, the lifting member, and the gas flow-guide cylinder, a first engagement portion provided on the outer periphery of the gas flow-guide cylinder, a second engagement portion provided on the positioning jig and adapted for engagement with the first engagement portion, a third engagement portion provided on the inner surface of the housing body, and a fourth engagement portion provided on the outer periphery of the positioning jig and adapted for engagement with the third engagement portion.

In the method and mechanism for lifting the gas flow-guide cylinder according to the present invention, when a solid crystalline material is to be placed in the heating container, the gas flow-guide cylinder is moved upward so that the bottom end thereof separates apart from the upper portion of the heating container. Therefore, when pieces of the solid crystalline material are piled up, the pieces of the solid crystalline material are prevented from coming into contact with the gas flow-guide cylinder. Also, the method and the mechanism can be realized readily and at lower cost.

Since the gas flow-guide cylinder does not rotate, the viewport provided therein does not deviate from an expected position. This allows a user to stably observe/measure the growth of a single crystal through the viewport of the housing body.

DESCRIPTION OF THE PREFERRED EMBODIMENT

An embodiment of the present invention will now be described in detail with reference to the drawings.

Figure 1A:
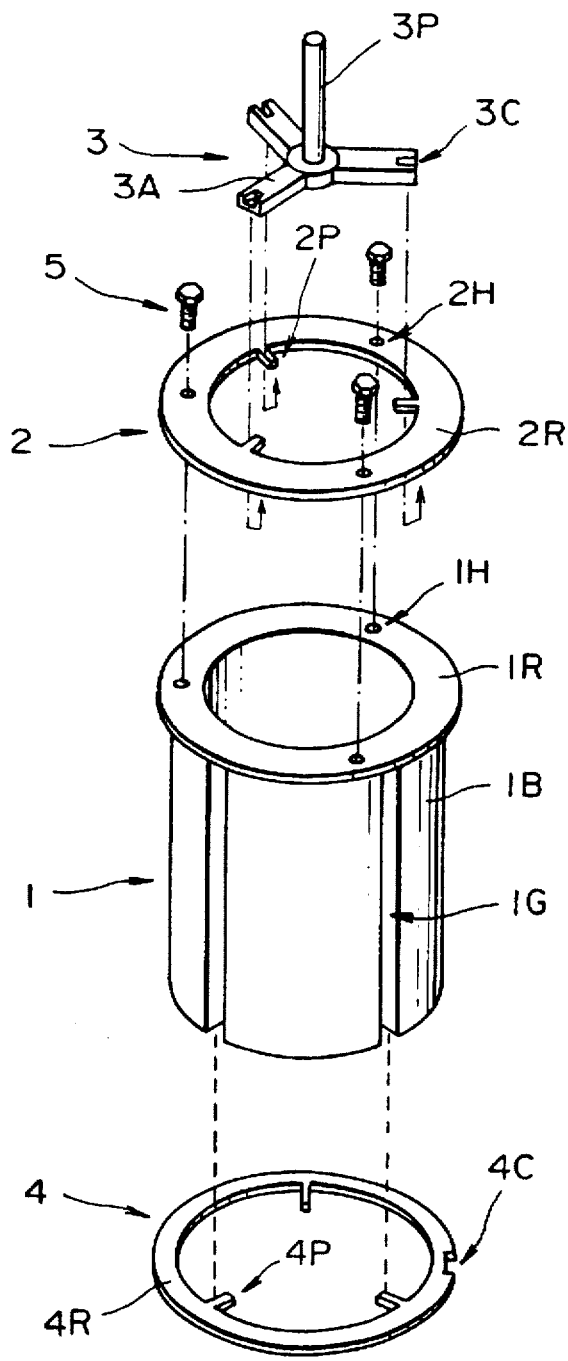
FIG. 1A is an exploded perspective view showing the overall structure of an embodiment of a mechanism for lifting a gas flow-guide cylinder of a crystal pulling apparatus according to the present invention.
Figure 1B:
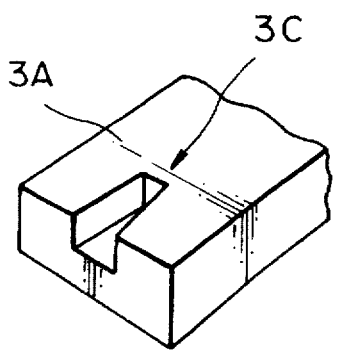
FIG. 1B is a perspective view showing the tip portion of a lifting jig shown in FIG. 1A.
Figure 1C:
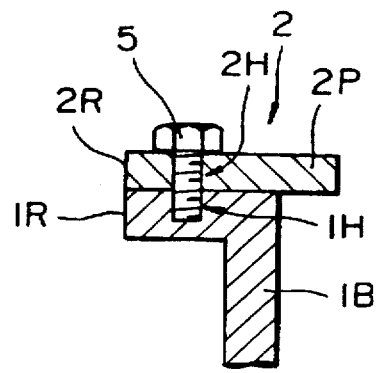
FIG. 1C is a sectional view showing the relationship between the gas flow-guide cylinder and an auxiliary jig shown in FIG. 1A.

FIGS. 1A–1C show the structures of an embodiment of a mechanism for lifting a gas flow-guide cylinder of a crystal pulling apparatus according to the present invention. FIG. 1A shows an exploded perspective view showing the overall structure of the mechanism. FIG. 1B shows a perspective view depicting the detailed structure of the tip portion of a lifting jig 3 shown in FIG. 1A. FIG. 1C shows a sectional view depicting the relationship between a gas flow-guide cylinder 1 and an auxiliary jig 2 shown in FIG. 1A.

As shown in FIG. 1A, the mechanism for lifting the gas flow-guide cylinder includes the gas flow-guide cylinder 1, the auxiliary jig 2, and a lifting jig 3.

The gas flow-guide cylinder 1 is formed of graphite or a like carbon material, a carbon-fiber-reinforced carbon composite material, nitride ceramics, carbide ceramics, or the like, and includes a tubular body 1B having a substantially cylindrical shape and a substantially annular flange portion 1R provided at the top portion of the tubular body 1B. Axially extending grooves 1G are formed in the outer periphery of the tubular body 1B at three positions in the circumferential direction thereof. Also, threaded holes 1H are formed in the flange portion 1R at three positions.

The auxiliary jig 2 has an annular body 2R having substantially the same annular shape as that of the flange portion 1R of the gas flow-guide cylinder 1. The auxiliary jig 2 also has three protrusions 2P which project from the inner periphery of the annular body 2R toward the center of the opening of the annular body 2R. Bolt holes 2H are formed in the annular body 2R at three positions. The bore diameter of the annular body 2R is equal to or greater than that of the gas flow-guide cylinder 1.

As shown in FIG. 1C, the flange portion 1R of the gas flow-guide cylinder 1 and the auxiliary jig 2 are attached together using bolts 5, which are inserted through the bolt holes 2H and screwed into the threaded holes 1H.

The lifting jig 3 includes a shaft portion 3P having substantially the same columnar shape as that of a seed crystal S, and three arms 3A which project outward from a substantially disk-shaped portion located at the bottom end of the shaft portion 3P. As shown in FIG. 1B, a cut portion 3C is formed in the tip of the arm 3A. The cut portion 3C is formed into a slightly greater size than that of the protrusion 2P of the auxiliary jig 2. The distance between the center of the shaft portion 3P and the tip end of the arm 3A is slightly smaller than the bore radius of the gas flow-guide cylinder 1 and also smaller than the bore radius of the auxiliary jig 2.

The shaft portion 3P is inserted into a concaved portion 23H1 of a chuck body 23 of a seed chuck 22 which is attached beforehand to a cable 110. Subsequently, a seed pin 24 is inserted into the chuck body 23 to thereby attach the lifting jig 3 to the cable 110.

A positioning jig 4 has an annular body 4R having an annular shape whose bore diameter is slightly greater than the outside diameter of the tubular body 1B of the gas flow-guide cylinder 1. The positioning jig 4 also has three protrusions 4P which project from the inner periphery of the annular body 4R toward the center of the opening of the annular body 4R. The protrusion 4P is formed into a slightly smaller size than that of the groove 1G formed in the outer periphery of the tubular body 1B. A single cut portion 4C is formed in the outer periphery of the annular body 4R. The cut portion 4C can engage a key protrusion (not illustrated) provided on an annular protrusion 101R, which is located in the vicinity of the joint portion where a main chamber 101M and a pull chamber 101P of a crystal pulling apparatus 100 are joined to each other.

The auxiliary jig 2, the lifting jig 3, and the positioning jig 4 are formed of a heat resistant material such as molybdenum, tungsten, SUS (stainless steel), a carbon material, or the like.

Next, a method of lifting a gas flow-guide cylinder by means of the above-described mechanism will be described with reference to FIGS. 1A–1C and FIGS. 2A and 2B.

First, when the crystal pulling apparatus 100 is assembled, the positioning jig 4 is placed on the annular protrusion 101R, which is located in the vicinity of the joint portion between the main chamber 101M and the pull chamber 101P, such that the cut portion 4C thereof is engaged with the key protrusion (not illustrated). Subsequently, the gas flow-guide cylinder 1 is gradually lowered such that the inwardly projecting protrusions 4P of the positioning jig 4 are engaged with the grooves 1G formed in the outer periphery of the gas flow-guide cylinder 1, until the flange portion 1R of the gas flow-guide cylinder 1 rests on the positioning jig 4.

Also, the seed chuck 22 is attached to the cable 110, and the shaft portion 3P is inserted into the concaved portion 23H1, which is primarily used for holding a seed crystal, of the seed chuck 22 to thereby attach the lifting jig 3 to the seed chuck 22.

Subsequently, a winding mechanism 109 is operated to release the cable 110 to thereby lower the lifting jig 3. The orientation of the lowering lifting jig 3 is adjusted such that the arms 3A of the lifting jig 3 do not interfere with the protrusions 2P of the auxiliary jig 2. As a result, the arms 3A clear the protrusions 2P and enter the gas flow-guide cylinder 1.

Once the arms 3A of the lifting jig 3 have entered the gas flow-guide cylinder 1, the winding mechanism 109 is stopped to stop releasing the cable 110 in order to stop lowering the lifting jig 3. Next, the cable 110 is rotated by the winding mechanism 109 so that the cut portions 3C of the arms 3A of the lifting jig 3 come just under the protrusions 2P of the auxiliary jig 2.

In this state, the cable 110 is wound up by the winding mechanism 109 to thereby raise the lifting jig 3. This brings about the engagement of the cut portions 3C in the arms 3A of the lifting jig 3 with the protrusions 2P of the auxiliary jig 2. Thus, when the cable 110 is further wound up by the winding mechanism 109, the gas flow-guide cylinder 1 rises together with the lifting jig 3 (see FIG. 2A). Subsequently, the operation of winding the cable 110 is stopped when the gas flow-guide cylinder 1 rises to an appropriate level. The gas flow-guide cylinder 1 is temporarily supported by the cable 110 at that level.

Figure 2A:
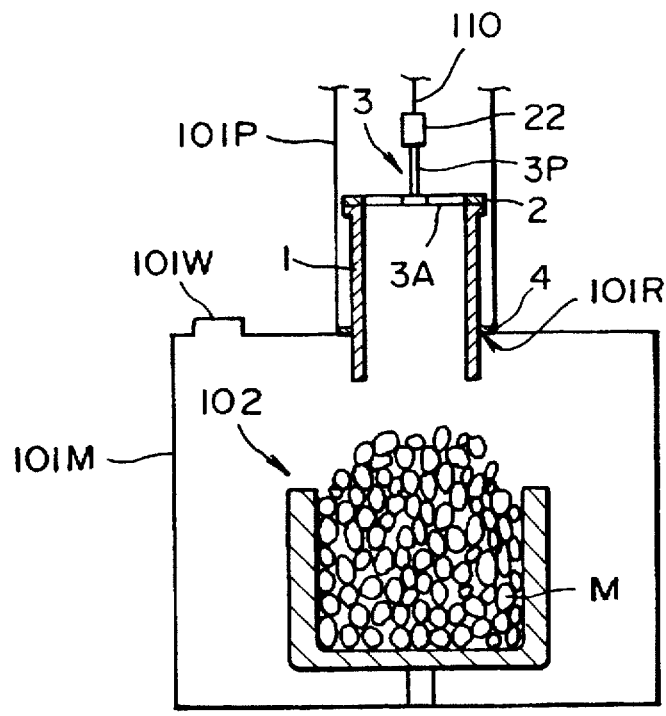
FIG. 2A is a diagram illustrating a method of lifting the gas flow-guide cylinder through use of the mechanism shown in FIG. 1A, wherein the gas flow-guide cylinder is located at its elevated position.
Figure 2B:
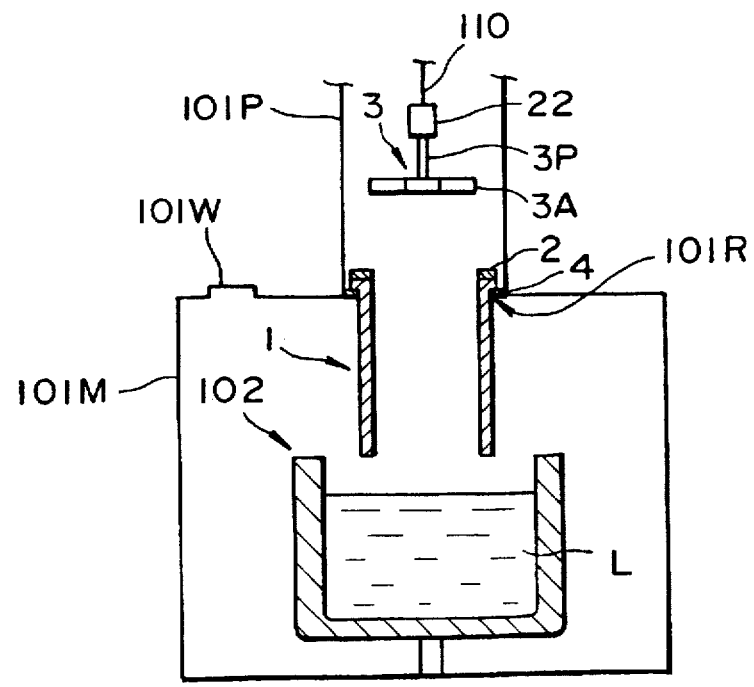
FIG. 2B is a diagram illustrating the method of lifting the gas flow-guide cylinder through use of the mechanism shown in FIG. 1A, wherein the gas flow-guide cylinder is located at its lowered position.
Figure 3:
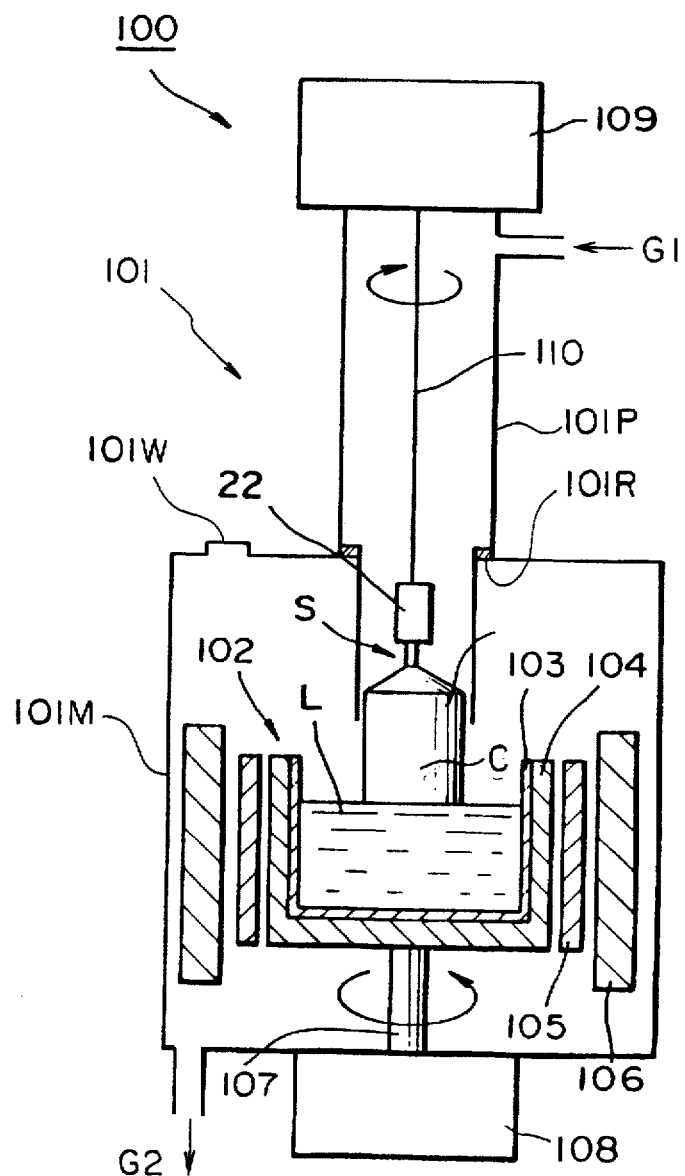
FIG. 3 is a sectional view showing the entire structure of a crystal pulling apparatus.
Figure 4:
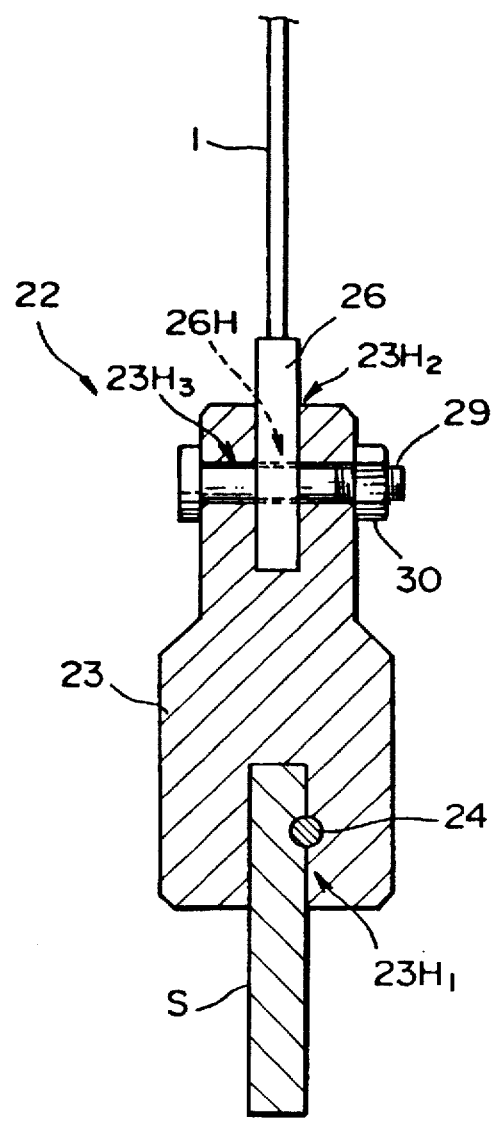
FIG. 4 is a sectional view showing the detailed structures of a seed chuck, the tip of a cable and their neighboring portions in the crystal pulling apparatus.

Thus, as shown in FIG. 2A, the bottom end of the gas flow-guide cylinder 1 is kept apart from the upper portion of the crucible 102, thereby allowing the crucible 102 to be piled considerably high with silicon material M in the solid form. Therefore, the production efficiency of a single crystal can be maintained at a higher level.

When the silicon material M is melted into a melt L in the crucible 102, the gas flow-guide cylinder 1 needs to be positioned just above the crucible 102 for growth of a single crystal. Thus, the winding mechanism 109 is again operated to release the cable 110 to thereby lower the lifting jig 3 together with the gas flow-guide cylinder 1. The gas flow-guide cylinder 1 is gradually lowered such that the inwardly projecting protrusions 4P of the positioning jig 4 are engaged with the grooves 1G formed in the outer periphery of the gas flow-guide cylinder 1, until the flange portion 1R of the gas flow-guide cylinder 1 rests on the positioning jig 4. Subsequently, the operation of releasing the cable 110 is stopped.

In this state, the gas flow-guide cylinder 1 is in engagement with the positioning jig 4, and the cut portion 4C formed in the outer circumferential portion of the positioning jig 4 is in engagement with the key protrusion (not illustrated) provided on the protrusion 101R which is provided on the inner periphery of the pull chamber 101P. Thus, the gas flow-guide cylinder 1 is prevented from rotating about the axis of the pull chamber 101P. Therefore, a viewport (not illustrated) provided in the gas flow-guide cylinder 1 at a predetermined position does not deviate from an expected position. This allows a user to stably observe/measure the growth of a single crystal through a viewport 101W of the main chamber 101M.

Subsequently, the winding mechanism 109 is operated to further release the cable 110 to thereby lower the lifting jig 3. As a result, the cut portions 3C in the arms 3A of the lifting jig 3 disengage from the protrusions 2P of the auxiliary jig 2 and lower just under the protrusions 2P.

In this state, the cable 110 is rotated by the winding mechanism 109 so that the cut portions 3C in the arms 3A of the lifting jig 3 deviate from their previous positions located just under the protrusions 2P of the auxiliary jig 2. Subsequently, the cable 110 is wound up by the winding mechanism 109 to thereby raise the lifting jig 3. The lifting jig 3 clears and rises above the auxiliary jig 2 (see FIG. 2B).

Subsequently, the lifting jig 3 is detached from the seed chuck 22, and the seed crystal S is attached to the seed chuck 22. The attached seed crystal S is then lowered toward the melt L, thereby making ready for growing a single crystal by the CZ method.

In the above-described embodiment, the chamber 101 serves as a housing body, and the crucible 102 serves as a heating container. The cable 110 and the seed chuck 22 serve as a lifting member. The chuck body 23 serves as a seed crystal holder which is used to hold a seed crystal and which is attached to a cable.

The protrusions 2P of the auxiliary jig 2 serve as a first anchorage portion, and the cut portions 3C formed in the tip end of the arm 3A of the lifting jig 3 serve as a second anchorage portion.

The grooves 1G formed in the outer periphery of the tubular body 1B of the gas flow-guide cylinder 1 serve as a first engagement portion. The inwardly projecting protrusions 4P of the positioning jig 4 serve as a second engagement portion. The key protrusion (not illustrated) provided on the protrusion 101R which is provided on the inner periphery of the pull chamber 101P in the vicinity of the bottom end of the pull chamber 101P serves as a third engagement portion. The cut portion 4C formed in the outer circumferential portion of the positioning jig 4 serves as a fourth engagement portion.

The present invention is not limited to the above-described embodiment. The above-described embodiment are mere examples, and those having the substantially same structure as that described in the appended claims and providing the similar action and effects are included in the scope of the present invention.

For example, the above embodiment are described while mentioning a semiconductor such as silicon as a material from which a single crystal is obtained. However, the present invention is not limited thereto, and other crystalline materials may be used.

In the above-described embodiment, a cable is provided as a lifting member capable of being moved upward/downward above a molten crystalline material. However, the present invention is not limited thereto, and other lifting member, for example, a shaft may be used.

In the above-described embodiment, the gas flow-guide cylinder 1, the auxiliary jig 2, and the positioning jig 4 have a substantially cylindrical or annular shape. However, the present invention is not limited thereto. The above-described parts may have any sectional shape such as a rectangular section, a polygonal section, an elliptical section, or the like.

In the above-described embodiment, the first anchorage portion located at the upper portion of the gas flow-guide cylinder is a protrusion, and the second anchorage portion of the lifting jig is a cut portion. However, the present invention is not limited thereto. On the contrary, the first anchorage portion may be a cut portion, and the second anchorage portion may be a protrusion. In this case, the cut portion may be formed, for example, in the bottom face of a protrusion which inwardly projects from the inner periphery of the auxiliary jig. Alternatively, other type of structure of anchorage may be acceptable.

In the above-described embodiment, the gas flow-guide cylinder and the auxiliary jig are formed separately from one another and are joined together using bolts. However, the present invention is not limited thereto. The first anchorage portion may be integrally formed with the gas flow-guide cylinder.

In the above-describe embodiment, the first engagement portion of the gas flow-guide cylinder is a groove, and the second engagement portion of the positioning jig is a protrusion. However, the present invention is not limited thereto. On the contrary, the first engagement portion may be an elongated protrusion which is formed on the outer periphery of the gas flow-guide cylinder, and the second engagement portion may be a cut portion which is formed in the inner periphery of the positioning jig. Alternatively, other type of structure of engagement may be acceptable.

In the above-describe embodiment, the third engagement portion of the housing body is a protrusion, and the fourth engagement portion of the positioning jig is a cut portion. However, the present invention is not limited thereto. On the contrary, the third engagement portion may be a cut portion, and the fourth engagement portion may be a protrusion. Alternatively, other type of structure of engagement may be acceptable.

In the above-described embodiment, the arms of the lifting jig, the respective protrusions, the bolt holes, and the grooves are provided in the quantity of three. However, the present invention is not limited thereto. They may be provided in the quantity of four or more.

What is claimed is:

1. A method of lifting a gas flow-guide cylinder of a crystal pulling apparatus which includes a heating container for accommodating a crystalline material and for melting the crystalline material through heating, and a gas flow-guide cylinder capable of being moved upward/downward above said heating container, and which is adapted to grow a single crystal from the crystalline material by a pulling method, said method of lifting said gas flow-guide cylinder comprising the steps of:

moving upward said gas flow-guide cylinder when the crystalline material in a solid form is to be placed in said heating container, so that the bottom end of said gas flow-guide cylinder is separated away from the top portion of said heating container in order to prevent contact between the solid crystalline material and the gas flow-guide cylinder; and moving downward said gas flow-guide cylinder when the single crystal is grown, so that the bottom end of said gas flow-guide cylinder is placed directly above said heating container.

2. A mechanism for lifting a gas flow-guide cylinder of a crystal pulling apparatus which includes a heating container for accommodating a crystalline material and for melting the crystalline material through heating, a lifting member capable of being moved upward/downward above the heating container, and a gas flow-guide cylinder capable of being supported in place above said heating container, and in which a seed crystal is first attached to said lifting member, and said lifting member is moved downward so as to cause the seed crystal to contact a melt of the crystalline material and is subsequently pulled upwardly, while a gas is flowing through said gas flow-guide cylinder toward the melt, so as to grow a single crystal from the melt, said mechanism comprising a lifting jig which can be engaged with and disengaged from said lifting member and said gas flow-guide cylinder, wherein when the crystalline material in the solid form is to be placed in said heating container, said lifting member is engaged with said gas flow-guide cylinder and said lifting member, and said lifting member is subsequently pulled upward so as to separate the bottom end of said gas flow-guide cylinder away from the top portion of said heating container.

3. A mechanism for lifting a gas flow-guide cylinder of a crystal pulling apparatus according to claim 2, wherein said lifting member includes a seed crystal holder for holding a seed crystal, and said lifting jig can be removably attached to said seed crystal holder.

4. A mechanism for lifting a gas flow-guide cylinder of a crystal pulling apparatus according to claim 2, wherein a first anchorage portion is provided at the upper portion of said gas flow-guide cylinder, and a second anchorage portion for anchorage with said first anchorage portion is provided on said lifting jig.

5. A mechanism for lifting a gas flow-guide cylinder of a crystal pulling apparatus according to claim 2, wherein said first anchorage portion is formed separately from said gas flow-guide cylinder and is attached to the upper portion of said gas flow-guide cylinder.

6. A mechanism for lifting a gas flow-guide cylinder of a crystal pulling apparatus according to claim 5, wherein said first anchorage portion is made of a heat resistant material.

7. A mechanism for lifting a gas flow-guide cylinder of a crystal pulling apparatus according to claim 2, wherein said lifting jig is made of a heat resistant material.

8. A mechanism for lifting a gas flow-guide cylinder of a crystal pulling apparatus according to claim 2, further comprising:

a positioning jig disposed above said heating container and supported by the inner surface of a housing body which accommodates said heating container, said lifting member, and said gas flow-guide cylinder;

a first engagement portion provided on the outer periphery of said gas flow-guide cylinder;

a second engagement portion provided on the positioning jig and adapted for engagement with said first engagement portion;

a third engagement portion provided on the inner surface of said housing body; and a fourth engagement portion provided on the outer periphery of said positioning jig and adapted for engagement with said third engagement portion.

* * * * *